United States Patent [19]
Mitra et al.

[11] Patent Number: 5,668,490
[45] Date of Patent: Sep. 16, 1997

[54] FLIP-FLOP WITH FULL SCAN CAPABILITY

[75] Inventors: Sundari S. Mitra, Milpitas; David Greenhill, Portola Valley; Philip A. Ferolito, Sunnyvale, all of Calif.

[73] Assignee: Sun Microsystems, Inc., Mountain View, Calif.

[21] Appl. No.: 640,562

[22] Filed: May 1, 1996

[51] Int. Cl.⁶ .................................... H03K 3/289
[52] U.S. Cl. .......................... 327/203; 327/404
[58] Field of Search ................. 327/202–3, 403–4

[56] References Cited

U.S. PATENT DOCUMENTS

| | | | |
|---|---|---|---|
| 5,444,404 | 8/1995 | Ebzery | 327/202 |
| 5,463,338 | 10/1995 | Yurash | 327/202 |

*Primary Examiner*—Margaret Rose Wambach
*Attorney, Agent, or Firm*—Christensen O'Connor Johnson & Kindness, PLLC

[57] ABSTRACT

A flip-flop with scan capability includes a four switches, a master stage, a slave stage and a scan-out logic gate. The flip-flop can operate in a functional mode, and a scan mode and receives a clock signal, a data signal, a scan clock signal and a scan-in signal. The flip-flop enters the functional mode when the clock signal runs free and the scan clock signal is held constant. The first switch receives the data signal and provides the data signal to the master stage for storage during a first part of a clock cycle. During a second part of the clock cycle, the third switch, connected between the master stage and the slave stage, closes, providing the data stored in the master stage to the slave stage and outputted as a q output signal. The flip-flop enters the scan mode when the clock signal is held constant and the scan clock signal runs free. The first switch is controlled to stay open by the constant clock signal. During a first part of a scan clock cycle, the second switch closes, providing the scan-in signal to the master stage. The data stored in the master stage is provided to the fourth switch, connected between the master stage and the scan-out logic gate. During a second part of the scan clock cycle, the fourth switch closes, providing the data stored in the master stage to the scan-out logic gate, which outputs a scan-out signal.

34 Claims, 5 Drawing Sheets

FLIP-FLOP WITH FULL SCAN CAPABILITY

FIELD OF THE INVENTION

This invention is related to flip-flops and, more particularly, to flip-flops for use in integrated circuits with scan design capability.

BACKGROUND

Large integrated circuits typically include test circuitry to test the functionality of the integrated circuit. In one test approach, known as scan design, predetermined data sequences are scanned into various internal registers of the integrated circuit during a scan mode. The integrated circuit is then allowed to operate for one or more clock cycles, and the resulting data in the internal registers is scanned out and compared to the expected resultant data. A fault is indicated when the scanned output data and the expected data do not match. The integrated circuit can be controlled to operate in a functional mode (i.e., normal operation) and a scan mode for testing.

However, the test circuitry needed to implement the scan design occupies area, significantly increasing the cost of the integrated circuit compared to a design without the scan design capability. In very complex integrated circuits such as, for example, a microprocessor, the scan circuitry may occupy a large proportion of the total integrated circuit area. Thus, using conventional scan design schemes, the integrated circuit may be impractical to manufacture with full scan design. Moreover, some conventional scan design schemes impact the timing of the functional circuitry due to the increased number of interconnects required and the addition of circuitry in the integrated circuit's functional data paths.

For example, FIG. 1 shows a block diagram of a flip-flop 100 with scan capability that can be used in an integrated circuit with scan design. The flip-flop 101 includes, for use in the functional mode, an input lead 101 for receiving a clock signal ck and an input lead 103 for receiving a data signal d for storage in the flip-flop 100. For use in the scan mode, the flip-flop 100 includes an input lead 105 for receiving a scan clock signal sclk and an input lead 107 for receiving the scan-in signal si. The flip-flop 100 includes an input lead 109 for receiving a scan enable signal se to select between the functional mode and the scan mode. When the scan enable signal se causes the flip-flop 100 to be in the functional mode, the flip-flop 100 provides an output signal q at an output lead 111. Conversely, when the scan enable signal se causes the flip-flop 100 to be in the scan mode, the flip-flop 100 provides a scan-out signal so at an output lead 113.

Typically, the flip-flop 100 includes a multiplexer (not shown) that receives the scan enable signal se at a control terminal, causing the multiplexer to select either the data signal d or the scan-in signal si. Consequently, in a large integrated circuit containing several thousand flip-flops in the scan design, a total amount of area used to implement the multiplexers in the flip-flops becomes significant. In addition, this conventional scheme requires that the scan enable signal se be routed to every flip-flop, further increasing the area occupied by the scan circuitry. Still further, the multiplexer in each flip-flop adds delay in the functional path of the flip-flop, which generally is undesirable in an integrated circuit.

SUMMARY

According to the present invention, a flip-flop with scan capability is provided. The flip-flop can operate in a functional mode and a scan mode and receives a clock signal, a data signal, a scan clock signal and a scan-in signal. The flip-flop outputs a q signal and a scan-out signal. In one embodiment, the flip-flop includes four switches, a master stage, a slave stage and a scan-out logic gate. The first and third switches are controlled by the clock signal so that one switch is closed when the other switch is open. Similarly, the second and fourth switches are controlled by the scan clock signal so that one switch is closed when the other switch is open. The clock signal and scan clock signal open and close the switches as described below.

The flip-flop enters the functional mode when the clock signal runs free and the scan clock signal is held constant. In the functional mode, the first switch receives the data signal and provides the data signal to the master stage for storage during a first part of a clock cycle of the clock signal. The second switch is coupled to receive the scan-in signal and provide the scan-in signal to the master stage when closed; however, the second switch is controlled to stay open by the constant scan clock signal. As a result, the scan-in signal is isolated from the master stage and only the data signal is provided to the master stage. During a second part of the clock cycle, the third switch, connected between the master stage and the slave stage, closes, thereby providing the data stored in the master stage to the slave stage. The data stored in the slave stage is outputted as the q output signal.

In contrast, the flip-flop enters the scan mode when the clock signal is held constant and the scan clock signal runs free. In the scan mode, the first switch is controlled to stay open by the constant clock signal, which isolates the data signal from the master stage. During a first part of a scan clock cycle, the second switch closes, thereby providing the scan-in signal to the master stage. Because the third switch is controlled to stay closed, the data stored in the master stage is provided to the fourth switch, which is connected between the master stage and the scan-out logic gate. During a second part of the scan clock cycle, the fourth switch closes, thereby providing the data stored in the master stage to the scan-out logic gate, which outputs the scan-out signal. Unlike the typical conventional flip-flops described above, this flip-flop does not require the scan enable signal to be routed to the flip-flop and, thus, does not require a multiplexer to select between the data signal and the scan-in signal. Thus, the timing and area impact of the multiplexer is substantially reduced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
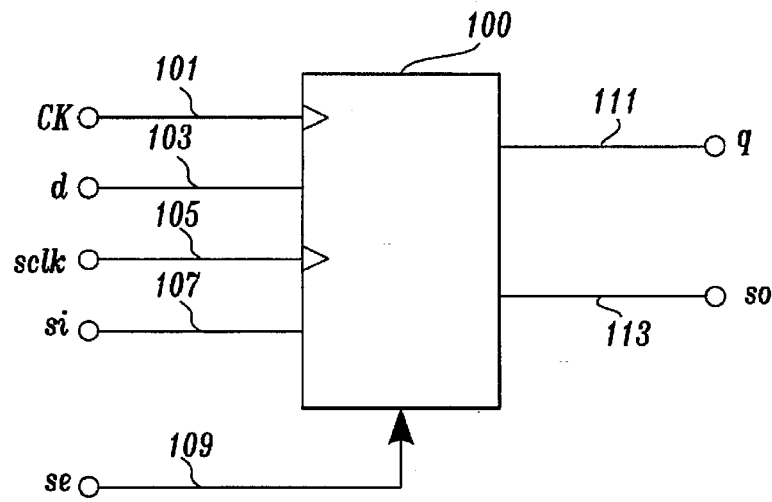
FIG. 1 is a block diagram of flip-flop with scan capability.
Figure 2:
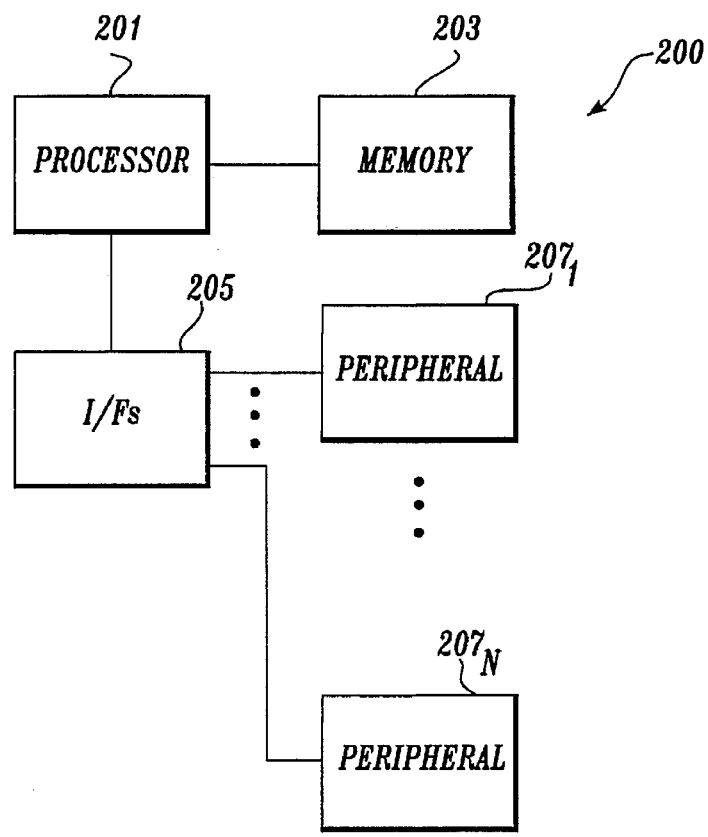
FIG. 2 is a block diagram of an electronic system with an integrated circuit having a flip-flop with scan capability according to one embodiment of the present invention.

FIG. 2 is a block diagram of an electronic system 200 having an integrated circuit 201 including a flip-flop with scan capability (described below in conjunction with FIGS. 3–8) according to one embodiment of the present invention. The electronic system 200 can be any type of electronic system. In this embodiment, the electronic system 200 is a computer system in which the integrated circuit 201 is a processor connected to a memory 203 and to interfaces 205. The interfaces 205 are connected to peripherals $207_1$–$207_N$, thereby allowing the processor to interact with these peripherals. The memory 203 and the interfaces 105 can be any type of memory or interface for use in computer systems. Likewise, the peripherals can be any type of peripheral such as, for example, displays, mass storage devices, keyboards or any other type of input or input-output device. In accordance with the present invention, the clock distribution network in the integrated circuit 201 includes flip-flops that reduce the area and timing impact of scan design circuitry within the integrated circuit, compared to other conventional scan-capable flip-flops.

Figure 3:
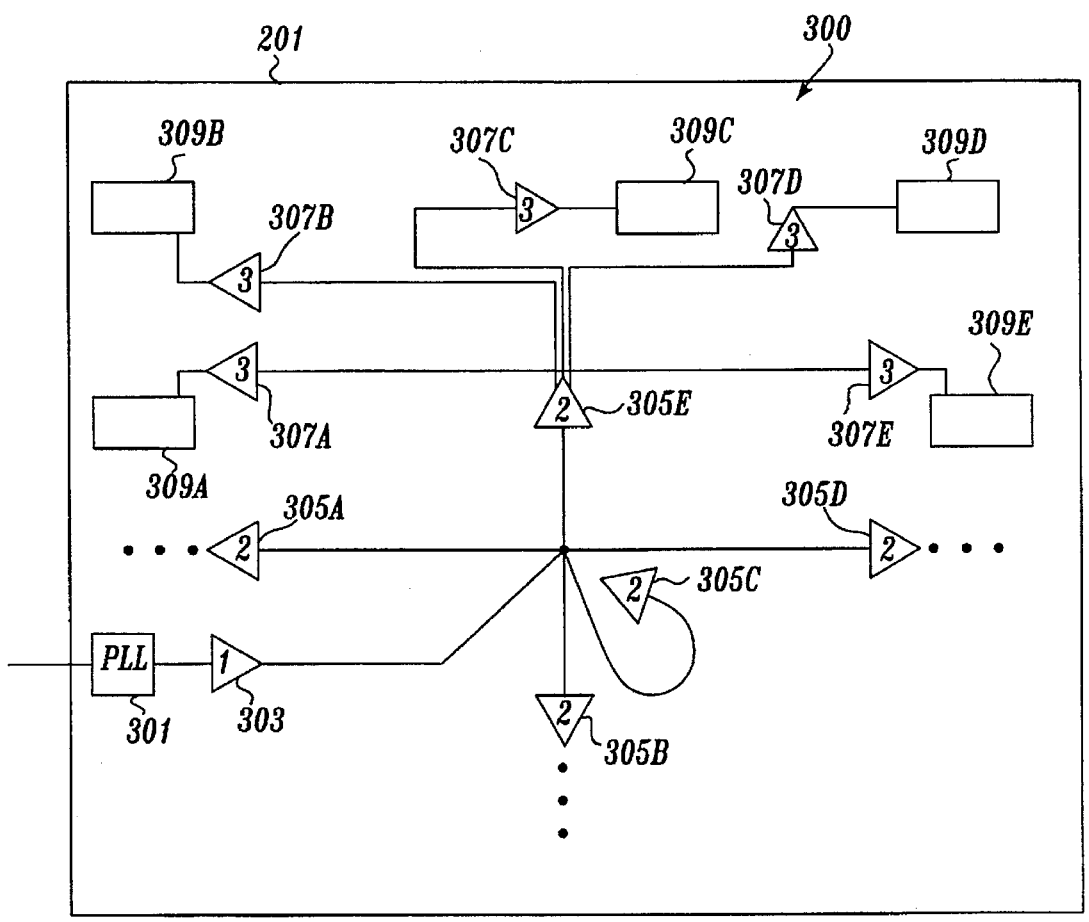
FIG. 3 is a block diagram of the integrated circuit depicted in FIG. 2.

FIG. 3 is a block diagram diagrammatically illustrating a scan design network 300 according to one embodiment of the present invention, implemented in the integrated circuit 201 (FIG. 2). The scan design network 300 includes a phase locked loop (PLL) 301, a first-level buffer 303, second-level buffers 305A–305E, third-level buffers 307A–307E and blocks 309A–309E that contain flip-flops according to the present invention.

The PLL 301 is coupled to receive a raw clock signal from an external source (not shown) and has an output lead connected to the input lead of the first-level buffer 303. The output lead of the first-level buffer 303 is connected to the input leads of the second-level buffers 305A–305E, which in turn each have one or more output leads connected to the input leads of one or more third-level buffers. For clarity, only the third level buffers 307A–307E driven by the second-level buffer 305E are shown in FIG. 3. The third-level buffers 307A–307E have output leads connected to the blocks 309A–309E, respectively. The blocks 309A–309E contain flip-flops according to the present invention.

In operation, the PLL 301 receives the raw clock signal and outputs a clock signal synchronized with the raw clock signal. For example, the PLL 301 can output a clock signal at a frequency equal to a multiple of the frequency of the raw clock signal. The clock signal provided by the PLL 301 is then distributed to the blocks 309A–309E through the first-level, second-level and third-level buffers. In this embodiment, each block 309A–309E includes several buffers and flip-flops as described below in conjunction with FIG. 4. The blocks 309A–309E may be implemented as disclosed in co-filed and commonly assigned U.S. patent application Ser. Nos. 08/640721 entitled "Clock Distribution Network With Modular Buffers", or 08/641509 entitled "A Reduced Skew Control Block Clock Distribution Network", both by S. Mitra and incorporated herein by reference.

Figure 4A:
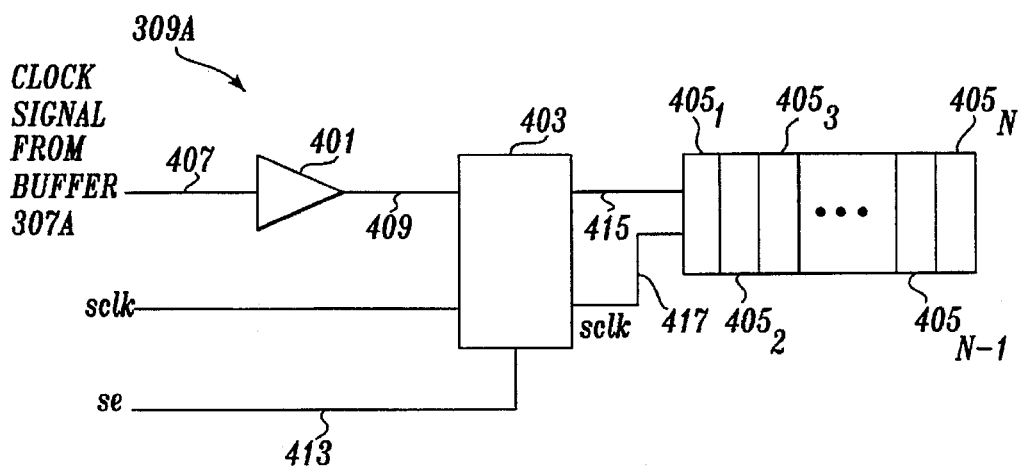
FIG. 4a–b is a block diagram illustrating part of a block depicted in FIG. 3.

FIG. 4A is a block diagram illustrating part of the block 309A (FIG. 3) according to one embodiment of the present invention. The block 309A includes a fourth-level buffer 401, a fifth-level buffer 403 and several flip-flops $405_1$–$405_N$ (described below in conjunction with FIGS. 5–8). Although not shown in FIG. 4, it is understood that the flip-flops have input leads and output leads that are connected to other circuitry within the integrated circuit 201 (FIG. 3) for inputting and outputting normal data and scan data, and vice versa.

The fourth level buffer 401 is coupled to receive a clock signal ck from the third-level buyer 307A (FIG. 3) through a line 407 and distributes the clock signal ck to the fifth-level buffer 403 through a line 409. Although not shown in FIG. 4, the fourth-level buffer 401 may also distribute the clock signal ck to other fifth-level buffers in the block 309A. The fourth-level buffer 401 may be implemented with any suitable buffer such as, for example, the fourth-level buffers disclosed in the aforementioned U.S. patent application Ser. Nos. 08/641509 and 08/640721.

In this embodiment, the fifth-level buffer 403 is coupled to receive a scan clock signal sclk from a clock generator (not shown) through a line 411. The scan clock signal sclk is routed to each fifth-level buffer in the integrated circuit 201 (FIG. 3) through a separate conventional clock distribution network (not shown). Typically, the scan clock distribution network is relatively simple compared to the distribution network 300 (FIG. 3) because the scan data is clocked into and out of the flip-flops at a relatively slow clock rate where much larger clock skews can be tolerated. The fifth-level buffer 403 also is coupled to receive a scan enable signal se from a control circuit (not shown) through a line 413. In response to the logic state of the se signal, the fifth-level buffer 403 enters either the functional mode or the scan mode to distribute to the flip-flops $405_1$–$405_N$ either the clock signal ck or the scan clock signal sclk. The fifth-level buffer 403 can be any suitable buffer circuit. For example, fifth-level buffer 403 can include a first conventional buffer to buffer the clock signal ck, and a second conventional buffer to buffer the scan clock signal sclk, with the conventional buffers having complementary output enable circuits (i.e., the output circuit of one conventional buffer is enabled when the other output circuit is disabled).

In the functional mode, the fifth-level buffer 403 provides the clock signal ck to the flip-flops $405_1$–$405_N$ over a line 415. Although the line 415 is shown as a single line, the clock signal ck can be a differential signal, with the line 415 representing a pair of signal lines. When providing the clock signal ck, the fifth-level buffer 403 holds the clock signal sclk at a logic high state. Conversely, in the scan mode, the fifth-level buffer 403 provides the scan clock signal sclk to the flip-flops $405_1$–$405_N$ over a line 417 while holding the clock signal ck at a logic high state.

Figure 4B:
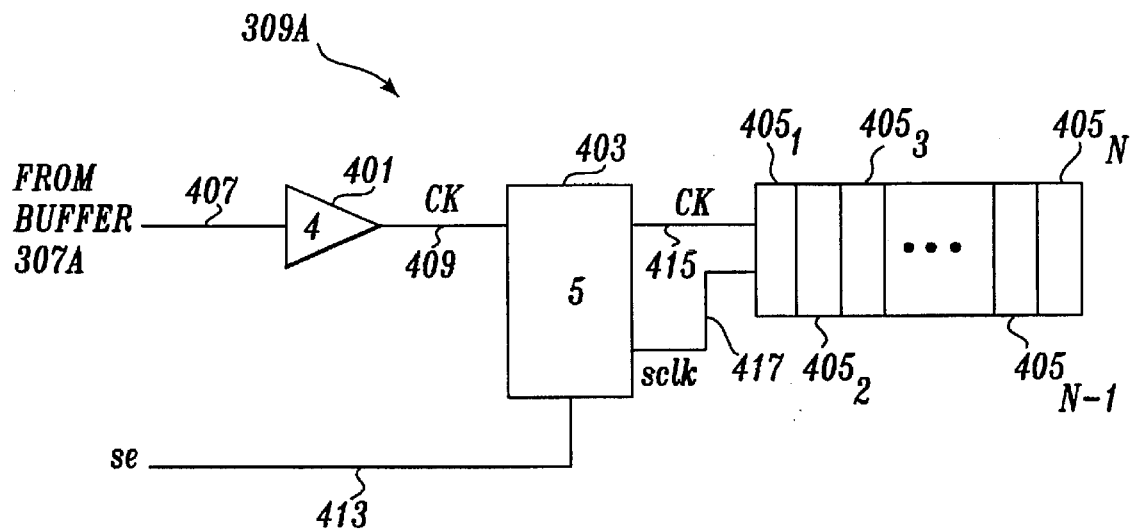

FIG. 4B is a block diagram illustrating part of the block 309A. (FIG. 3) according to another embodiment of the present invention. This embodiment is similar to the embodiment shown in FIG. 4A, except that the scan clock is multiplexed onto the line 407 during the scan mode. For example, referring to FIG. 3, a two-input multiplexer can be inserted between the PLL 301 and the first-level buffer 303 to select either the PLL output signal or a scan clock signal received at the other input lead of the multiplexer. Alternatively, the PLL 301 can be disabled to allow the raw clock signal (which is typically slower than the PLL output signal) to propagate to the first-level buffer 303.

Referring back to FIG. 4B, because the scan clock signal sclk is multiplexed onto the line 407, the fifth-level buffer 403 does not require a separate input terminal to receive the scan clock signal sclk. One embodiment of the fifth-level buffer 403 depicted in FIG. 4B is disclosed in co-filed and commonly assigned U.S. patent application Ser. No. 08/640660 entitled "Final Stage Buffer in a Clock Distribution Network" by S. Mitra, which is incorporated herein by reference. In this embodiment, the fifth-level buffer 403 may drive as many as sixteen flip-flops.

Figure 5:
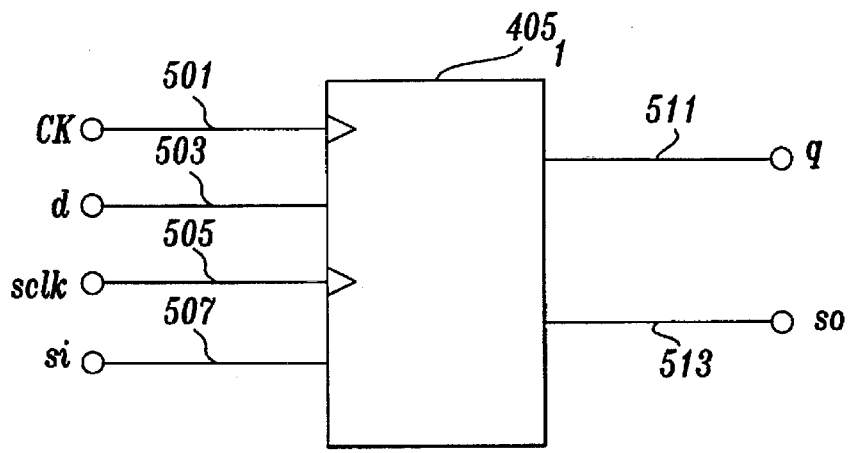
FIG. 5 is a block diagram of one embodiment of a flip-flop depicted in FIG. 4, in accordance with the present invention

FIG. 5 is a block diagram of the flip-flop $405_1$ (FIG. 4) according to one embodiment of the present invention. The flip-flops $405_2$–$405_N$ are substantially identical to the flip-flop $405_1$. The flip-flop $405_1$ includes input leads 501–507 and output leads 511 and 513. The input lead 501 is connected to the fifth-level buffer 403 through the line 415 (FIG. 4) to receive the clock signal ck. The input lead 503 is coupled to receive the data signal d provided by other circuitry (not shown) within the integrated circuit 201 (FIG. 3). The input lead 505 is connected to the fifth-level buffer 403 through the line 417 to receive the scan clock signal sclk from a scan clock generator (not shown). The input lead 507 is coupled to receive the scan-in signal si provided by other circuitry (not shown) within the integrated circuit 201. Because the fifth-level buffer 403 receives the scan enable signal se and, in response, provides either the clock signal ck or the scan clock signal sclk, the flip-flop $405_1$ does not require a scan enable input lead.

The flip-flop $405_1$ provides an output signal q on the output lead 511 in response to the clock signal ck and the data signal d. The flip-flop $405_1$ provides a scan-out signal so at the output lead 513 in response to the scan clock signal sclk and the logic state of the flip-flop. Typically, as is well known in the art of scan design, the scan-out lead of one flip-flop is connected to the scan-in lead of another flip-flop to form a scan chain, except for the first and last flip-flop of the scan chain, which are typically connected to I/O pins of the integrated circuit.

In the operation, the flip-flop $405_1$ can operate in either a functional mode or a scan mode. In the functional mode, the fifth-level buffer 403 (FIG. 4) forces the scan clock signal sclk to be in a logic high state while allowing the clock signal ck to cycle normally. The flip-flop $405_1$ receives the clock signal ck and the data signal d at input leads 501 and 503, respectively. The flip-flop $405_1$ operates as follows for each cycle of the clock signal ck while in the functional mode. The logic state of the data signal d is loaded into the flip-flop $405_1$ during the rising edge of the clock signal ck. On the falling edge of the clock signal ck, the flip-flop $405_1$ causes the output signal q at output lead 511 to have the same logic state as the loaded data signal. The flip-flop $405_1$ also causes the scan-out signal so to have the same logic state as the output signal q.

In the scan mode, the fifth-level buffer 403 (FIG. 4) provides the scan clock signal sclk to the flip-flop $405_1$ while forcing the clock signal ck to be a logic high state. The flip-flop $405_1$ receives the scan-in signal si and the scan clock signal sclk at the input leads 505 and 507, respectively. For each cycle of the scan clock signal sclk, the logic state of the scan-in signal si is loaded into the flip-flop $405_1$ during the rising edge of the scan clock signal sclk. On the falling edge of the scan clock signal sclk to the flip-flop $405_1$ causes the scan-out signal so to have the same logic state as the loaded scan-in signal.

Figure 6:
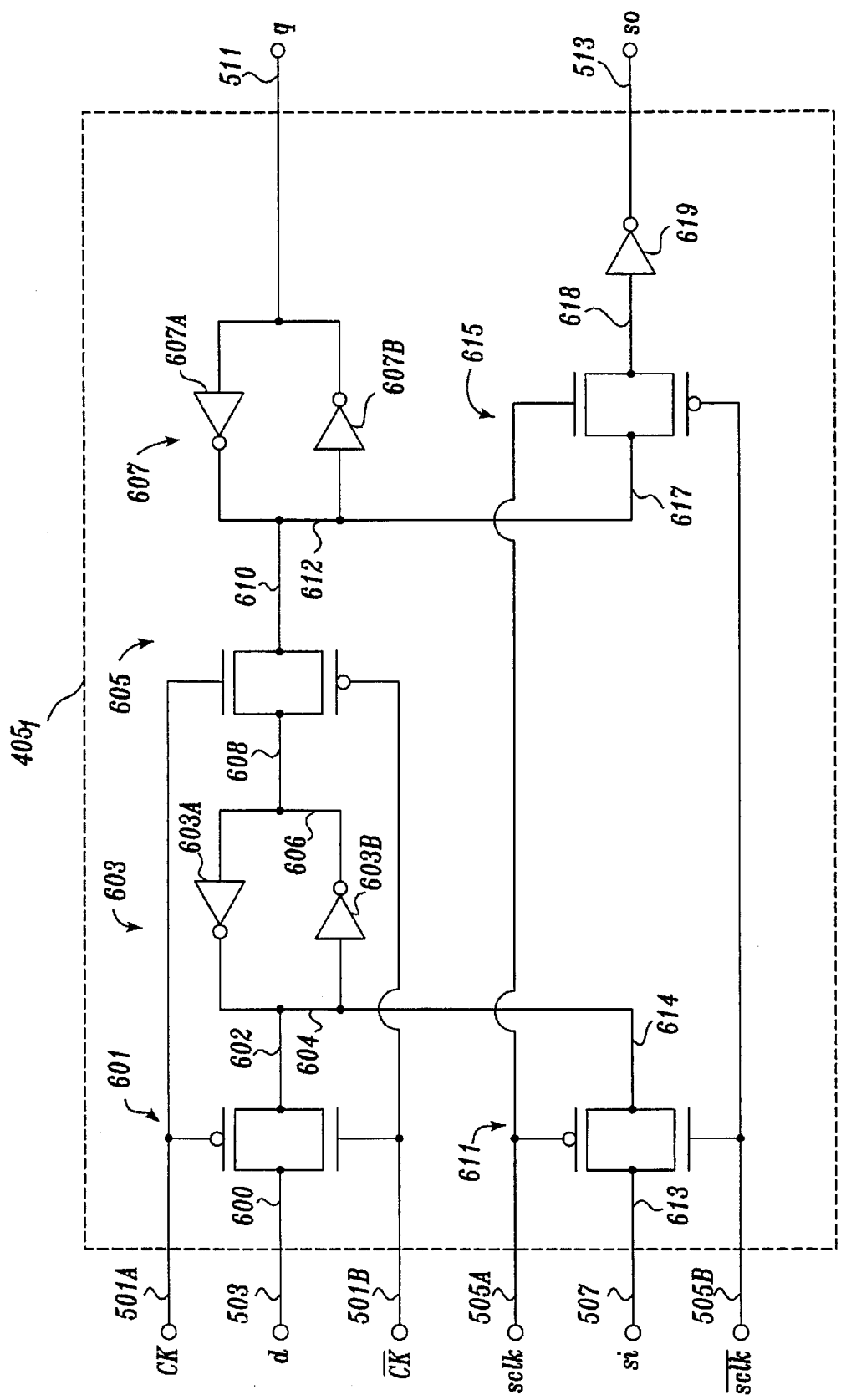
FIG. 6 is a schematic diagram of a flip-flop according to one embodiment of the present invention.

FIG. 6 is a schematic diagram of the flip-flop $405_1$ (FIG. 5) according to one embodiment of the present invention. The flip-flop $405_1$ includes switches 601, 605, 611 and 615, a master stage 603, a slave stage 607 and an inverter 619. In this embodiment, the switches 601, 605, 611 and 615 are implemented in conventional metal-oxide-semiconductor field effect transistors (MOSFETs). More specifically, the switches are conventional complementary metal-oxide-semiconductor (CMOS) transmission gates (i.e., a n-channel FET with its channel connected in parallel with the channel of a p-channel FET). Accordingly, when a switch is closed (i.e., the current path is completed), the CMOS transmission gate is conductive and, conversely, when the switch is open (i.e., the current path is open-circuited), the CMOS transmission gate is non-conductive. Of course, in other embodiments, other types of switch circuits can be used instead of CMOS transmission gates. The term MOSFET is used herein to also refer to FET technologies using silicon gates.

In this embodiment, the clock signals ck and sclk are differential signals. Thus, the clock input lead 501 (FIG. 5) is implemented with true input lead 501A and complementary input lead 501B and, similarly, the scan clock input lead 505 (FIG. 5) is implemented with true input lead 505A and complementary input lead 505B.

The switch 601 has an input lead 600 connected to the flip-flop input lead 503 to receive the data signal d. The switch 601 is also connected to the clock input leads 501A and 501B to receive the clock signals ck and ck. More specifically, the p-channel FET of the switch 601 has its gate connected to the flip-flop input lead 501A, whereas the n-channel FET of the switch 601 has its gate connected to the flip-flop input lead 501B. Consequently, the switch 601 opens and closes when the clock signal ck is in a logic high and logic low state, respectively. The switch 601 also has an output lead 602 connected to an input lead 604 of the master stage 603. In this embodiment, the master stage 603 is implemented with two inverters 603A and 603B connected in a "back-to-back" configuration (i.e., the input lead of each inverter is connected to the output lead of the other inverter), with the input lead of the inverter 603B connected to the output lead 602. As a result, the data signal d is transmitted to the master stage 603 when the switch 601 is closed and isolated from the master stage 603 when the switch 601 is open.

The master stage 603 has an output lead 606 connected to an input lead 608 of the switch 605. More specifically, the output lead of the inverter 603B is connected to the output lead 606 of the master stage 603. The switch 605 has its control leads connected to the clock input leads 501A and 501B so that the switch 605 is opened and closed when the clock signal ck is in it logic low state and logic high state, respectively. Accordingly, the switch 601 is open when the switch 605 is closed, and vice versa. An output lead 610 of the switch 605 is connected to an input lead 612 of the slave stage 607. The slave stage 607 is implemented with inverters 607A and 607B connected in the aforementioned back-to-back configuration. The slave stage 607 has an output lead 614 connected to the flip-flop output lead 511. Consequently, the output signal provided by the master stage 603 is transmitted to the slave stage 607 when the switch 605 is closed and isolated from the slave stage 607 when the switch 605 is open.

The switch 611 has an input lead 613 connected to the flip-flop input lead 507 to receive the scan-in signal si. The p-channel and n-channel FETs of the switch 611 arc connected to the scan clock input leads 505A and 505B, respectively. Consequently, the switch 611 opens and closes when the scan clock signal sclk is in a logic high and logic low state, respectively. The switch 611 also has an output lead 614 that is connected to the input lead 613 when the switch 611 is closed. The output lead 614 is also connected to the input lead 604 of the master stage 603. As a result, the scan-in signal si is transmitted to the master stage 603 when the switch 611 is closed and isolated from the master stage 603 when the switch 611 is open.

In this embodiment, the switch 615 has an input lead 617 connected to the input lead 612 of the slave stage 607. The n-channel and p-channel FETs of the switch 617 are respectively connected to the scan clock input leads 505A and 505B. Consequently, the switch 617 is open when the switch 611 is closed, and vice versa. The switch 617 has an output lead 618 connected to the input lead of the inverter 619. The output lead of the inverter 619 is connected to the flip-flop output lead 513.

In the functional mode, the flip-flop $405_1$ operates as follows. The flip-flop $405_1$ receives the data (i.e., data signal d) to be loaded at the input lead 503. On the falling edge of the clock signal ck, the switch 601 closes and the data signal d is transmitted to the master stage 603. The back-to-back inverters of the master stage 603 store the logic state of the data signal d in the master stage 603. For example, if the data signal d is at a logic high level, the inverter 603B of the master stage 603 outputs a logic low level to the inverter 603A, which in turn outputs a logic high level to the input lead of the master stage 603. The master stage 603 outputs the complement of the data signal d to the switch 605, which is opened when the switch 601 is closed and vice versa.

On the rising edge of the clock signal ck, the switch 601 is opened and the switch 605 is closed. The master stage 603 continues to store the logic level of the data signal d and output the complement of the data signal d to the switch 605. As a result, the complement of the data signal d is then transmitted to the slave stage 607, which stores the complement of the data signal d as described for the master stage 603. Thus, the slave stage 607 complements the complement of the logic level of the data signal d. Accordingly, the output signal q has a logic level equivalent to the logic level of the data signal d stored in the flip-flop $405_1$ at the end of the previous clock cycle.

In addition, because the scan clock signal sclk is held at a logic high level during the functional mode, the switch 611 is open and the switch 615 is closed. As a result, the rising edge of the clock signal ck also allows the complement of the data signal d to be transmitted to the inverter 619, which then outputs the scan-out signal so with the same logic level as the output signal q. Accordingly, the logic level of the scan-out signal is also equivalent to the value stored in the flip-flop $405_1$.

In the scan mode, the flip-flop $405_1$ operates as follows. The flip-flop $405_1$ receives the scan-in data (i.e., scan-in signal si) to be loaded at the scan-in lead 507. On the falling edge of the scan clock signal sclk, the switch 611 closes and the scan-in signal si is transmitted to the master stage 603. Because during the scan mode the switch 601 is open, there is no contention on the input lead 604 of the master stage 603. The master stage 603 then stores the logic state of the scan-in signal si as previously described.

In addition, on the rising edge of the scan clock signal sclk, the switch 611 is opened and the switch 615 is closed. As a result, the complement of the scan-in signal si stored in the master stage 603 is transmitted to the inverter 619. Thus, the scan-out signal has the same logic level as the scan-in signal received by the flip-flop $405_1$ at the falling edge of the previous scan clock signal cycle. In a typical scan design using a scan chain, the scan-out signal of one flip-flop is transmitted to the scan-in input lead of another flip-flop. Thus, using flip-flops according to this embodiment of the present invention allows the flip-flops to be serially loaded with predetermined data in the conventional scan design manner.

The contents of the flip-flops are scanned out as follows. Because the switch 615 is opened when the switch 611 is closed, the current logic state of the scan-out signal so (i.e., the value stored in the flip-flop $405_1$ on the previous clock cycle) remains unchanged. Thus, at the beginning of the first scan clock cycle in entering the scan mode, the output data corresponding to the data stored in the flip-flops is present at the so output leads of the flip-flops. Consequently, the stored data of each flip-flop becomes the scan-in data of the next flip-flop in the scan chain, except for the last flip-flop in the scan chain which typically is coupled to an I/O pin of the integrated circuit. Thus, using flip-flops according to this embodiment of the present invention allows the flip-flops to be serially scanned out in the conventional scan design manner.

Figure 7:
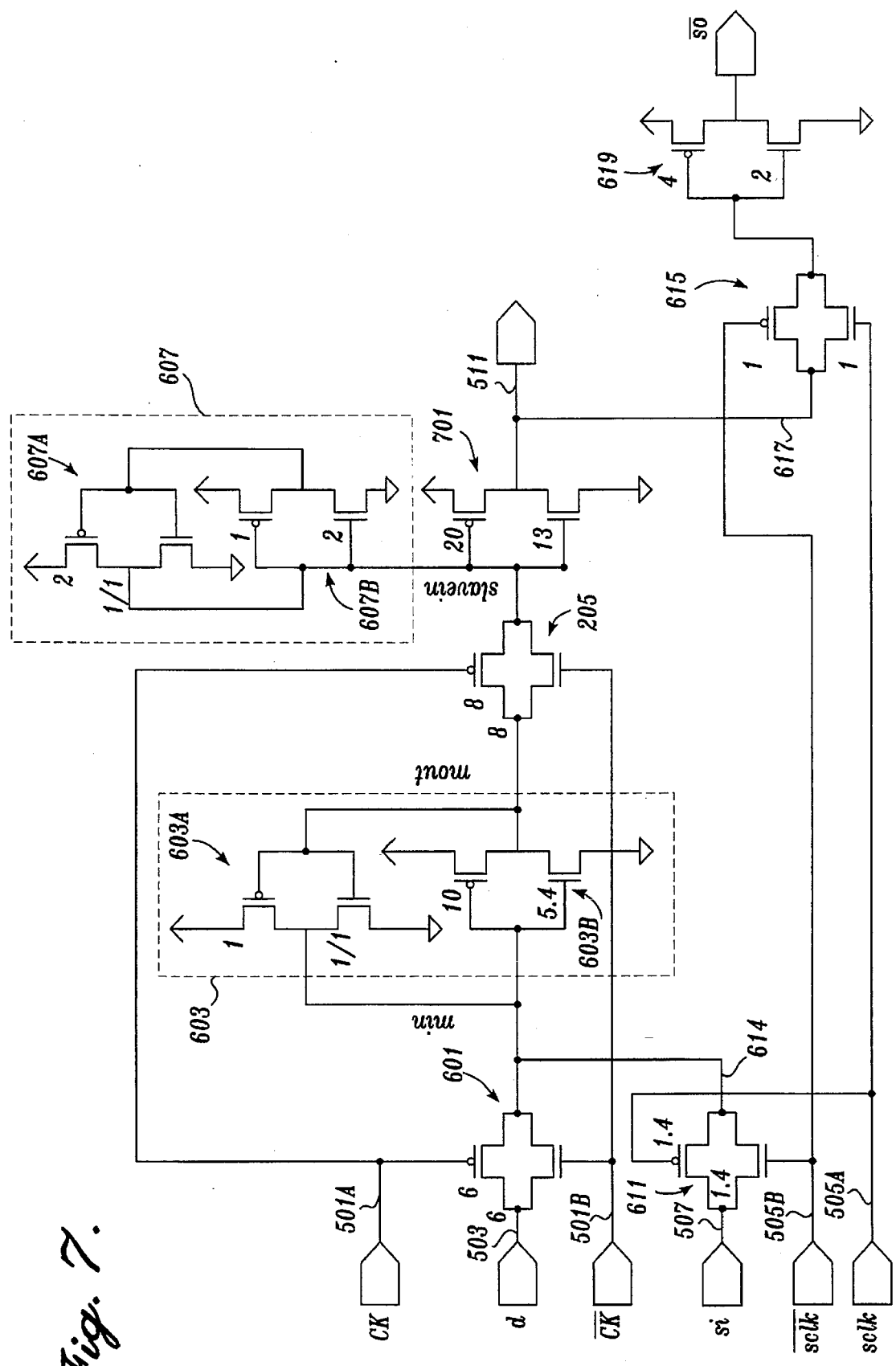
FIG. 7 is a schematic diagram of a flip-flop according to another embodiment of the present invention.

FIG. 7 is a schematic diagram of another embodiment of the flip-flop $405_1$ according to the present invention. This embodiment is substantially similar to the embodiment of FIG. 6, with the following slight changes. In this embodiment, the inverters 603A, 603B, 607A and 607B are implemented using standard CMOS inverters. Also, an additional inverter 701 is connected in parallel with the inverter 607B (FIG. 6) of the slave stage 607 and the slave stage 607 is not connected to the flip-flop output lead 511. Instead, the output lead 703 of the inverter 701 connected to the flip-flop output lead 511. Because the inverter 701 is connected in parallel with the inverter 607B, the inverter 701 outputs the same logic level as the slave stage 607, with the slave stage serving as a latching circuit. In addition, the input lead 617 of the switch 615 is connected to the output lead 703 of the inverter 701 instead of the input load 612 of the slave stage 607 as in the embodiment of FIG. 6. As a result, this embodiment outputs the scan-out complement signal so instead of the scan-out signal so.

The embodiments of the flip-flop described above are illustrative of the principles of this invention and are not intended to limit the invention to the particular embodiments described. For example, in another embodiment, one skilled in the art of flip-flop design can implement a flip-flop according to the present invention in bipolar or junction FET (JFET) technology without undue experimentation. Accordingly, while a preferred embodiment of the invention has been illustrated and described, it will be appreciated that in view of this disclosure, various changes can be made therein without departing from the spirit and scope of the invention.

The embodiments of the invention in which an exclusive property or privilege is claimed are defined as follows:

1. A circuit comprising:
    a first switch having a control lead, an input lead and an output lead, wherein said control lead of said first switch is adapted to receive a first clock signal, and said input lead of said first switch is adapted to receive a first data signal;
    a master stage having an input lead and an output lead, said input lead of said first stage coupled to said output lead of said first switch, wherein said master stage is capable of storing a logic value dependent on a logic state of a master-in signal received at said input lead of said master stage and of outputting a master-out signal at said output lead of said master stage having a logic state dependent on said logic value stored in said master stage;
    a second switch having a control lead, an input lead and an output lead, wherein said control lead of said second switch is adapted to receive a second clock signal, said input lead of said second switch is adapted to receive a second data signal, and said output lead of said second switch is coupled to said input lead of said master stage;
    a third switch having a control lead, an input lead and an output lead, wherein said control lead of said third switch is adapted to receive said first clock signal, and said input lead of said third switch is coupled to said output lead of said master stage;

a slave stage having an input lead and an output lead, said input lead of said slave stage coupled to said output lead of said third switch, wherein said slave stage is capable of storing a logic value dependent on a logic state of said master-out signal provided by said master stage;

a fourth switch having a control lead, an input lead and an output lead, wherein said control lead of said fourth stage is adapted to receive said second clock signal, and said input lead of said fourth switch is coupled to said output lead of said third switch; and a first logic gate having an input lead coupled to said output lead of said fourth switch.

2. The circuit of claim 1 wherein responsive to said first clock signal said first switch closes when said third switch opens and opens when said third switch closes.

3. The circuit of claim 1 wherein responsive to said second clock signal said second switch closes when said fourth switch opens and opens when said fourth switch closes.

4. The circuit of claim 1 wherein said first logic gate is an inverter.

5. The circuit of claim 1 wherein said first switch comprises:

a p-channel field effect transistor (FET) having a gate and a channel, wherein said channel of said p-channel FET of said first switch couples said input lead of said first switch to said output lead of said first switch, and said gate of said p-channel FET of said first switch is coupled to receive said first clock signal; and a n-channel FET having a gate and a channel, wherein said channel of said n-channel FET of said first switch couples said input lead of said first switch to said output lead of said first switch, and said gate of said n-channel FET of said first switch is coupled to receive a complemented first clock signal.

6. The circuit of claim 5 wherein said third switch comprises:

a p-channel FET having a gate and a channel, wherein said channel of said p-channel FET of said third switch couples said input lead of said third switch to said output lead of said third switch, and said gate of said p-channel FET of said third switch is coupled to receive said complemented first clock signal; and a n-channel FET having a gate and a channel, wherein said channel of said n-channel FET of said third switch couples said input lead of said third switch to said output lead of said third switch, and said gate of said n-channel FET of said third switch is coupled to receive said first clock signal.

7. The circuit of claim 6 wherein said mater stage comprises two inverters connected back-to-back.

8. The circuit of claim 7 wherein said slave stage comprises two inverters connected back-to-back.

9. The circuit of claim 1 wherein said circuit has a first operational mode and a second operation mode.

10. The circuit of claim 9 wherein said circuit enters said first operational mode in response to said second clock signal remaining in a substantially constant logic state and said first clock signal alternating between logic states and wherein said circuit enters said second operational mode in response to said first clock signal remaining in a substantially constant logic state and said second clock signal alternating between logic states.

11. The circuit of claim 10 wherein said second switch remains open during said first operational mode and said first switch remains open during said second operational mode.

12. The circuit of claim 11 wherein, during said first operational mode, said first switch closes during a first part of a clock cycle of said first clock signal causing said first data signal to serve as said master-in signal.

13. The circuit of claim 11 wherein, during said first operational mode, said third switch opens during a second part of a clock cycle of said first clock signal causing slave section and said first logic gate to receive said master-out signal provided by said master stage.

14. The circuit of claim 11 wherein, during said second operational mode, said second switch closes during a first part of a clock cycle of said second clock signal causing said second data signal to serve as said master-in signal.

15. The circuit of claim 11 wherein, during said second operational mode, said fourth switch opens during a second part of a clock cycle of said second clock signal causing first logic gate to receive said master-out signal provided by said master stage.

16. The circuit of claim 1 further comprising a second logic gate coupling said output lead of said third switch to said input lead of said fourth switch.

17. The circuit of claim 16 wherein said second logic gate comprises an inverter.

18. A computer system comprising:

a memory;

an interface capable of interfacing with one or more peripherals;

and a processor coupled to said memory and said interface, said processor including a circuit comprising:

a first switch having a control lead, an input lead and an output lead, wherein said control lead of said first switch is adapted to receive a first clock signal, and said input lead of said first switch is adapted to receive a first data signal;

a master stage having an input lead and an output lead, said input lead of said first stage coupled to said output lead of said first switch, wherein said master stage is capable of storing a logic value dependent on a logic state of a master-in signal received at said input lead of said master stage and of outputting a master-out signal at said output lead of said master stage having a logic state dependent on said logic value stored in said master stage;

a second switch having a control lead, an input lead and an output lead, wherein said control lead of said second switch is adapted to receive a second clock signal, said input lead of said second switch is adapted to receive a second data signal, and said output lead of said second switch is coupled to said input lead of said master stage;

a third switch having a control lead, an input lead and an output lead, wherein said control lead of said third switch is adapted to receive said first clock signal, and said input lead of said third switch is coupled to said output lead of said master stage;

a slave stage having an input lead and an output lead, said input lead of said slave stage coupled to said output lead of said third switch, wherein said slave stage is capable of storing a logic value dependent on a logic state of said master-out signal provided by said master stage;

a fourth switch having a control lead, an input lead and an output lead, wherein said control lead of said fourth stage is adapted to receive said second clock signal, and said input lead of said fourth switch is coupled to said output lead of said third switch; and a first logic gate having an input lead coupled to said output lead of said fourth switch.

19. The circuit of claim 18 wherein responsive to said first clock signal said first switch closes when said third switch opens and opens when said third switch closes.

20. The circuit of claim 18 wherein responsive to said second clock signal said second switch closes when said fourth switch opens end opens when said fourth switch closes.

21. The circuit of claim 18 wherein said first logic gate is an inverter.

22. The circuit of claim 18 wherein said first switch comprises:

a p-channel field effect transistor (FET) having a gate and a channel, wherein said channel of said p-channel FET of said first switch couples said input lead of said first switch to said output lead of said first switch, and said gate of said p-channel FET of said first switch is coupled to receive said first clock signal; and a n-channel FET having a gate and a channel, wherein said channel of said n-channel FET of said first switch couples said input lead of said first switch to said output lead of said first switch, and said gate of said n-channel FET of said first switch is coupled to receive a complemented first clock signal.

23. The circuit of claim 22 wherein said third switch comprises:

a p-channel FET having a gate and a channel, wherein said channel of said p-channel FET of said third switch couples said input lead of said third switch to said output lead of said third switch, and said gate of said p-channel FET of said third switch is coupled to receive said complemented first clock signal; and a n-channel FET having a gate and a channel, wherein said channel of said n-channel FET of said third switch couples said input lead of said third switch to said output lead of said third switch, and said gate of said n-channel FET of said third switch is coupled to receive said first clock signal.

24. The circuit of claim 23 wherein said master stage comprises two inverters connected back-to-back.

25. The circuit of claim 24 wherein said slave stage comprises two inverters connected back-to-back.

26. The circuit of claim 18 wherein said circuit has a first operational mode and a second operation mode.

27. The circuit of claim 26 wherein said circuit enters said first operational mode in response to said second clock signal remaining in a substantially constant logic state and said first clock signal alternating between logic states and wherein said circuit enters said second operational mode in response to said first clock signal remaining in a substantially constant logic state and said second clock signal alternating between logic states.

28. The circuit of claim 27 wherein said second switch remains open during said first operational mode and said first switch remains open during said second operational mode.

29. The circuit of claim 28 wherein, during said first operational mode, said first switch closes during a first part of a clock cycle of said first clock signal causing said first data signal to serve as said master-in signal.

30. The circuit of claim 28 wherein, during said first operational mode, said third switch opens during a second part of a clock cycle of said first clock signal causing said slave section and said first logic gate to receive said master-out signal provided by said master stage.

31. The circuit of claim 28 wherein, during said second operational mode, said second switch closes during a first part of a clock cycle of said second clock signal causing said second data signal to serve as said master-in signal.

32. The circuit of claim 28 wherein, during said second operational mode, said fourth switch opens during a second part of a clock cycle of said second clock signal causing first logic gate to receive said master-out signal provided by said master stage.

33. The circuit of claim 18 further comprising a second logic gate coupling said output lead of said third switch to said input lead of said fourth switch.

34. The circuit of claim 33 wherein said second logic gate comprises an inverter.

* * * * *

UNITED STATES PATENT AND TRADEMARK OFFICE
CERTIFICATE OF CORRECTION

PATENT NO.   : 5,668,490
DATED        : September 16, 1997
INVENTOR(S)  : Sundari S. Mitra, David Greenhill, Philip A. Ferolito It is certified that error appears in the above-identified patent and that said Letters Patent is hereby corrected as shown below:

Columm 9, claim 7,
Line 53, delete "mater" and insert -- master --;

Column 11, claim 20,
Line 11, delete "end" and insert -- and --;

Signed and Sealed this

Twenty-fifth Day of December, 2001

*Attest:*

*Attesting Officer*

JAMES E. ROGAN
*Director of the United States Patent and Trademark Office*